US006731209B2

(12) United States Patent
Wadlow et al.

(10) Patent No.: US 6,731,209 B2
(45) Date of Patent: May 4, 2004

(54) CONTROL SYSTEM WITH CAPACITIVE DETECTOR

(75) Inventors: David Wadlow, Basking Ridge, NJ (US); Frank Scholten, Livingston, NJ (US); Ralph Giffone, Bloomfield, NJ (US); Kenneth Gerenraich, Seal Beach, CA (US)

(73) Assignee: Gerenraich Family Trust, Aliso Viejo, CA (US)

( * ) Notice: Subject to any disclaimer, the term of this patent is extended or adjusted under 35 U.S.C. 154(b) by 0 days.

(21) Appl. No.: 10/062,866

(22) Filed: Jan. 30, 2002

(65) Prior Publication Data

US 2002/0175814 A1 Nov. 28, 2002

Related U.S. Application Data

(60) Provisional application No. 60/267,113, filed on Feb. 7, 2001.

(51) Int. Cl.⁷ .............................................. G08B 13/26
(52) U.S. Cl. ........................................ 340/562; 324/686
(58) Field of Search ........................ 340/562; 324/683, 324/76.52, 76.53, 686; 331/18, 25, 65

(56) References Cited

U.S. PATENT DOCUMENTS

| 4,449,122 A | 5/1984 | Whitmer |
| 4,722,372 A | 2/1988 | Hoffman et al. |
| 4,879,461 A | 11/1989 | Philipp |
| 4,921,131 A | 5/1990 | Binderbauer et al. |
| 4,938,384 A | 7/1990 | Pilolla et al. |
| 4,967,935 A | 11/1990 | Celest |
| 5,086,526 A | 2/1992 | Van Marcke |
| 5,199,118 A | 4/1993 | Cole et al. |
| 5,217,035 A | 6/1993 | Van Marcke |
| 5,397,028 A | 3/1995 | Jesadanont |
| 5,492,247 A | 2/1996 | Shu et al. |
| 5,625,908 A | 5/1997 | Shaw |
| 5,632,414 A | 5/1997 | Merriweather, Jr. |
| 5,651,044 A | 7/1997 | Klotz, Jr. et al. |
| 5,730,165 A | 3/1998 | Philipp |
| 5,781,942 A | 7/1998 | Allen et al. |
| 5,933,288 A | 8/1999 | Plesko |
| 5,952,835 A | 9/1999 | Coveley |
| 6,373,235 B1 | 4/2002 | Barker |

*Primary Examiner*—Thomas J. Mullen
(74) *Attorney, Agent, or Firm*—Walter A. Hackler

(57) ABSTRACT

A capacitive sensor system for controlling operation of a device in response to a rate of change in capacitance due to motion of a proximate object includes at least two sense electrodes disposed on a surface and a phase locked loop, including a voltage controlled oscillator and a phase/frequency comparator, connected between the sense electrodes and an RC network for providing an operating frequency to the sense electrodes. A circuit loop, including a reference oscillator, provides a fixed frequency reference for the phase locked loop to follow and a phase delay circuit connected between said phase/frequency comparator and said voltage controlled oscillator causes the voltage controlled oscillation to run ahead of the reference oscillator. A trigger circuit provides a control output in response to a change in phase shift between said fixed frequency and said operating frequency.

24 Claims, 4 Drawing Sheets

CONTROL SYSTEM WITH CAPACITIVE DETECTOR

CROSS-REFERENCE TO RELATED APPLICATION

This application claims the benefit of provisional application No. 60/267,113, filed Feb. 7, 2001, incorporated herein by reference.

The present invention is generally related to automatic control systems and is more particularly directed to a system for controlling operation of a device utilizing a capacitive sensor.

BACKGROUND

A great number of capacitive sensors have been heretofore developed for the sensing of persons or materials to provide an alarm, indicating signal, or control. For example, capacitive sensing circuits have been used for alarm systems to provide a signal in response to touching of a particular area or the proximity of an object. In other instances, capacitive sensing circuits have been utilized to detect the presence or absence of liquids and solids and thereafter initiating an indicator for alarm signals or measurement. Capacitive sensors have also been used to measure the distance to an object, material size, material moisture content, oil contamination, humidity, pressure, liquid level and in fact have formed the basis for sensing in numerous measurement and detection applications.

With regard to dispenser control, it is often preferable to operate a device without direct handling thereof by human interaction. For example, it is preferable for sanitary reasons in washing to avoid the need for physical contact with faucet handles, towel dispensers, hand dryers, soap dispensers and the like.

While a number of control systems have been developed for such touch-free devices in order to conserve water and soap, they have been plagued by false activation. That is, devices are turned on without the actual presence of a human body part. This, of course, leads to fluid waste that is contrary to the original purpose of the control system.

Further, in the case of soap dispensers and the like, safety becomes a factor when such liquids are falsely dispensed and accumulate on a floor, or other surface, where subsequent slippage thereon may cause bodily harm.

The problem of false activation, and more generally of reliable as well as sensitive detection of a proximate object by a proximity sensor, stems from the need to reliably discriminate between a small change in signal strength due to changes in the proximity of the object versus changes in signal strength which can occur due to other factors such as sensor noise, sensor drift or induced changes in the signal due to actual changes in the ambient environment itself, such as contamination of the sensor and other effects which can give rise to signals which are similar in magnitude to or even larger than the detection signal itself.

In the case of infrared proximity sensors, which are for instance frequently used in current commercial non-contact soap dispensers and other similar devices, false activation can arise due to the effects of stray, extraneous light impinging on the sensor due to spurious reflections in shiny objects or otherwise, or a failure to detect an object can occur due to variations in the reflectivity of the object or contamination of the optics.

In the case of capacitive proximity sensors, where an object is sensed via the detection of a change in capacitance due to the proximate presence of the object, sensitive detection of a proximate object in everyday environments is made difficult and unreliable because the actual capacitance changes due to a proximate object can be small compared with other changes in capacitance due to changes in the surroundings.

Certain commonly occurring variations in the environment which can cause such interfering variations in capacitance include contamination of the surface of the electrodes or other structures in the sensing field region by gradual dirt accumulation or condensed moisture, significant changes in ambient humidity, gradual variations in the proximity or composition of other nearby structures and objects, or variations in sensor mounting location, all of which can give rise to small alterations in the electric field shape or intensity between the sensor electrodes thereby altering the charge state and hence capacitance between the electrodes.

There are currently two basic types of capacitive proximity sensor in the known prior art. In one case, often referred to as the parallel plate type, there is only one sense electrode at the sensor and the capacitance to ground is measured. If the object to be sensed is generally conductive and grounded it can effectively form the second electrode such that movement of the object towards or away from the primary sense electrode changes the capacitance and this change is measured and related to the distance or proximity of the object.

If the object to be sensed is instead not electrically conducting, a second stationary electrode is incorporated at a fixed distance away and connected to ground and the object to be sensed is passed between the two electrodes giving rise to a change in capacitance. In the second case, called the fringe field type, there are instead two sense electrodes disposed near one another at the sensor and the object which is sensed changes the capacitance between them by changing the electric field by dielectric or conductive effects. The resulting change in capacitance is sensed and this can then be related to a change in distance or proximity of the object. Fringe field type capacitive proximity sensors are widely used industrially in manufacturing applications where sensor installations are typically specified and fixed, and other potentially interfering environmental factors can be controlled.

Such devices nevertheless also frequently incorporate an additional electrode to separately sense for and thereby compensate for drift due to surface contamination. The maximum sensing distance is the sensor range and this is related to the sensitivity of the capacitance change sensing technique, the nature and size of the object to be detected and the physical size of the sense electrodes. Larger sense electrodes provide greater range.

More sensitive detection provides greater range with a given electrode size and a given object to be sensed, which is a performance advantage in applications where larger electrode structures are undesirable and greater range is desired. However, more sensitive detection of changes in capacitance does not by itself provide reliability where significant capacitance changes can also arise due to environmental factors.

SUMMARY OF THE INVENTION

The present invention has been developed to overcome the shortcomings of the hereinbefore known systems in order to provide for a capacitive sensor system with increased sensitivity and reliability.

This is accomplished by providing a sensitive means for instead detecting the time rate of change of capacitance only.

This quantity is denoted mathematically as dC/dt and is distinctly different from a measurement of the difference between two capacitances as is typical of the prior art.

$$\frac{dC}{dt} = \text{the rate of change of capacitance with respect to time}$$

This is hence contrary to the known prior art systems where instead detection is based on a change in capacitance.

In the present invention, the detection, which is performed in the phase domain, utilizing a continuously operating control loop, is thereby advantageously insensitive to gradual changes in capacitance due to changes in the environment which may be of any absolute magnitude provided that these changes occur over sufficient lengths of time and hence at rates which are below the detection sensitivity for dC/dt.

It should be appreciated that although a time rate of change signal could in principle alternatively be derived from the output of various prior art capacitive sensors, which instead measure capacitance change, by electronically differentiating that signal, such a derived signal would not then provide the required reliable and sensitive detection. This is because the very act of differentiating a sensor signal makes the resulting signal noisier and hence less reliable.

In the present invention an intrinsically motion sensitive capacitive sensing means is thus provided for detecting the movement of an object, such as for example a person's hand, in a region which is within a prescribed distance range from the sensor. The system in accordance with the present invention provides a means for reliably detecting small motions of a hand towards the sensor when it is within a sensing region. Moreover this reliability is independent of whether or not the person is electrically grounded or even intermittently grounded during sensor operation as may occur in the case of someone who is washing their hands.

This reliability inherently provides immunity to false activation because the sensor continuously adapts to the electrical characteristics of the surroundings and gradual changes in those surroundings of an overall magnitude greater than that due to the introduction of a hand into the sensing region. The sensor thereby has zero drift.

Thus, the present invention is functional in a range of different surroundings without requiring manual adjustment. In addition, the present invention is highly immune to RF and other externally generated electrical field interferences, has low electromagnetic emissions itself and consumes little power. This last mentioned feature enables extended operation by battery.

SUMMARY OF THE INVENTION

A capacitive sensor system in accordance with the present invention for controlling operation of a device in response to the rate of change in capacitance due to the motion of a proximate object generally comprises at least two sense electrodes disposed in a spaced apart relationship for enabling the establishment of an electrical field between the sense electrodes. An electronic circuit provides a control output signal in response to a rate of change in capacitance of the sense electrodes due to motion of the proximate object within the field without intermediate electronic differentiation of signals related to a change in capacitance.

Preferably, the sense electrodes are disposed on a planar surface, and in that configuration, enabling the establishment of an electric field extending outwardly and between the sense electrodes.

More particularly, the electronic circuit may include a phase locked frequency control loop (PLL) which includes a voltage controlled oscillator (VCO), a fixed frequency reference oscillator for the VCO to follow, a phase/frequency comparator, a phase delay network for delaying the phase of the VCO output with respect to that of the reference and which acts to cause the VCO frequency to run ahead of the reference oscillator when the loop is phase locked and a loop filter which integrates the phase error signal from the comparator and thereby defines the dynamic response of the loop.

The characteristics of the loop filter are such as to slow down and in fact match the dynamic response of the loop to the characteristic timescale of motion of the object to be detected. Additionally, a phase sensitive trigger circuit is connected between the VCO and the reference oscillator and generates the sensor output signal whenever those two signals are in phase.

The VCO is connected to the sense electrodes such that any increases in capacitance there act to slow the VCO frequency and vice versa. A capacitance change caused by an object moving into the sensing region of the sense electrodes causes a phase shift in the operating frequency with respect to that of the reference which is greater for greater rates of change in capacitance of the sense electrodes.

The phase error signal thus generated by the comparator is integrated in the loop filter and if the phase error is accumulated at a fast enough rate, such that the phase shift exceeds the threshold defined by the phase delay network, then a sensor output or trigger signal is generated. This signal can then be used for control of another device, such as a soap pump where the sensor is used to detect hand motion near a non-contact soap dispenser, or a proximity indication via connection to a display or alarm device.

In the preferred embodiment of the present invention the trigger signal generating circuit includes a D-flop circuit and in an alternative embodiment the trigger circuit includes a voltage comparator.

In the preferred embodiment a frequency divider is included between the VCO and the phase/frequency comparator which causes the VCO frequency to operate at a frequency which is a fixed multiple of that of the reference oscillator.

Also, in the preferred embodiment of the present invention the control circuit incorporates an additional feedback path for the loop which is parallel to the loop filter and is for eliminating multiple trigger signals for very large phase delay errors which would otherwise be caused by very large dC/dt's generated at the sense electrodes. This feedback path incorporates a circuit which is adaptive to very large phase error signals in such a way that for small error signals it provides negligible output while for very large signals it does not allow the phase difference to move out of the +/−90 degree range. In the preferred embodiment this feedback path incorporates diodes in conjunction with an RC demodulating network.

More particularly, the VCO provides an operating frequency to the sense electrodes which is sufficiently high to insure that if the object is a human hand and the individual is grounded that the hand is nevertheless detected as a dielectric object. This eliminates any possible detection artifacts due to variations in the electrical groundedness of the hand and, as is known in the prior art, places a minimum operating frequency requirement on the sensor of a few hundred kilohertz. Hence, in the preferred embodiment and where the object is a hand and the device is a soap dispenser, the operating frequency is set to about 0.5 MHz. In this regard and alternatively for other sensing applications, the avoidance of conduction effects may impose other preferred constraints on the operating frequency. Such constraints are within the scope of the invention.

Preferably a grounded shield electrode is also provided and disposed in a spaced apart relationship parallel to and above the sense electrodes. This eliminates the sensing electric field in the region above the shield in order that that region may be utilized without falsely activating the system. In an alternative embodiment the shield electrode may be split into two halves and each half driven at the same voltage as the opposing sense electrode so as to reduce the capacitance between the sense electrodes and shield and thereby enhance the sensitivity and hence sensor range. This alternative requires additional electronic circuitry to generate the voltage waveform for the shield.

BRIEF DESCRIPTION OF THE DRAWINGS

The advantages and features of the present invention will be better understood by the following description when considered in conjunction with the accompanying drawings in which.

DETAILED DESCRIPTION

Figure 1:
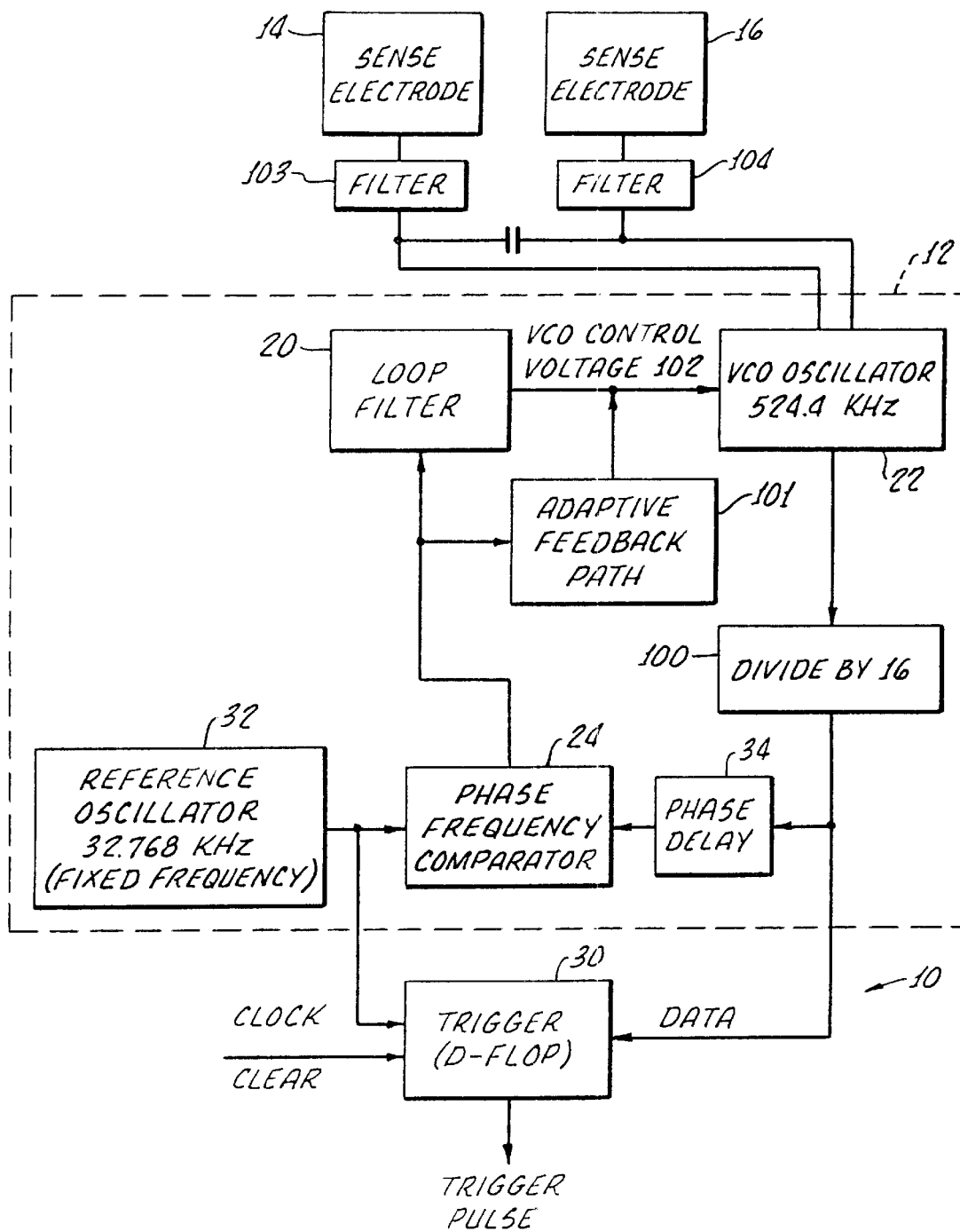
FIG. 1 is a block diagram of one embodiment of the present invention in which the trigger utilizes a D-Flop circuit.

With reference to FIG. 1 there is shown a block diagram of sensor electronics 10 in accordance with the present invention. The circuit set forth is an example of electronic circuitry for providing a control output signal in response to a rate of change in capacitance of the sense electrodes due to motion of the proximate object within the field without intermediate electronic differentiation of signals related to a change in capacitance.

The overall principle of operation is as follows: A phase locked frequency control loop (PLL) 12 is interconnected with sense electrodes 14 and 16. The PLL includes a voltage controlled oscillator (VCO) 22 which has an output, the frequency of which is linearly related to the input control voltage 102. The output is connected to a phase/frequency comparator via a frequency divider 100 and a fixed phase delay network 34.

A reference oscillator 32 is also connected to the comparator and generates a continuous fixed frequency signal. The phase/frequency comparator 24 generally provides a high voltage (Vcc) if the divided VCO frequency is lower than that of the reference and a low voltage (0) if the divided VCO frequency is higher than that of the reference.

Furthermore, when the two frequencies are equal but there is a phase difference between them the comparator 24 detects the rising edges of the two signals and generates a pulse output, the width of which is proportional to that phase difference where this is between +/−360 degrees. The average loop control voltage is driven between 0 and Vcc in a linear manner with the overall result that the phase/frequency comparator tends to drive the rising edges of both signals presented to it to a zero phase difference. When this is achieved the PLL is thereby phase locked in such a way that the phase of the divided VCO frequency is always ahead of that of the reference frequency by the amount defined by the phase delay network 34. This is the normal quiescent state of the sensor.

In the preferred embodiment the frequency divider 100 divides the VCO frequency by 16 in order that the VCO runs at 16 times the frequency of the reference oscillator. Utilizing a frequency divider in this way allows the use of an inexpensive lower frequency, low power, reference oscillator and is not otherwise essential for the basic operation of the sensor. The VCO and phase/frequency comparator may, for example, be elements of a CD74HC4046AM chip manufactured by Texas Instruments.

The loop filter 20 is an RC network and it incorporates a large capacitor which dominates the dynamic response of the control loop. A small resistor is put in series with this capacitor and connected to the VCO input 102. This resistor allows the control loop to overpower a small amount of circuit noise and thus stabilize the phase relationship between the VCO and reference signals.

An additional feedback path 101 is also preferably included which is connected in parallel with the loop filter 20. This is for eliminating false multiple trigger signals which would otherwise occur in instances or applications where very large phase delay errors are sometimes generated due to very large dC/dt's occurring at the sense electrodes. Such large signals could occur in applications where there might be unusually rapid motion of the object being detected or by motions of that object at close range.

Such instances of occasional large signals could occur if the sensor is used to detect hand motion in a soap dispenser application. This feedback path incorporates a circuit which is adaptive to very large phase error signals in such a way that for small error signals it provides negligible output while for very large signals it does not allow the phase difference to move out of the +/−90 degree range. In the preferred embodiment this parallel feedback path incorporates two series diodes in the direction of phase shift which causes a trigger and one diode in the opposite direction together with an RC demodulating circuit. This provides an alternate parallel path of feedback which the phase error signal cannot overpower.

A sensitive phase comparator, such as for example, a D type flip-flop 30 is connected to the reference oscillator 32 and the frequency divided VCO signal where the reference is connected to the clock input and the VCO is connected to the data input. This device is used as a trigger to generate the sensor output signal. As the capacitance increases at the sense electrodes due to movement of an object, such as a hand (not shown), into the activation region and where this is done at a sufficient rate to overpower the loop, the phase between these signals will tend to shift. Whenever this shift equals or exceeds the phase threshold set by the phase delay network 34 the data input will be low instead of high at the time of the clock transition and a trigger output pulse will be generated.

It will be appreciated that the arrangement described above is configured to detect only positive dC/dt's as opposed to negative dC/dt's or both positive and negative dC/dt's. This means that the sensor configuration described above only generates an output when the object being detected is moving towards the sense electrodes instead of away from the sense electrodes. This mode of operation is by design and is specifically advantageous in a soap dispenser application where it is desired to have soap dispensed only when a hand is moving towards the dispenser and not when the hand is being withdrawn from the dispenser. This mode of operation is appropriate for simplicity and intuitive ease of use by typical users of a soap dispenser and also confers an additional and advantageous performance feature which is specific to a soap dispenser application.

This additional feature applies in the case when a user requires additional or consecutive deliveries of soap which therefore necessitates additional or consecutive generations of sensor trigger signals. In this case, and because the sensor is sensitive to positive dC/dt and adjusts to static changes in capacitance, due for instance to that induced by the static presence of a hand, the user does not need to completely withdraw and reintroduce their hand into the sensing region and may instead alternatively, simply advance their hand further towards the sense electrodes or alternatively move their hands up and down in small motions within the activation region whereupon sensor activation and soap delivery will occur upon the detection of each movement towards the sense electrodes.

If required and advantageous for other applications, the sensor circuit could readily be reconfigured to instead detect negative dC/dt events where instead the trigger signal would be generated if the object being detected is moving out of and away from the activation region instead of into and towards it. Such a sensor could in principle be employed in applications where it is desired to detect the motion of an object which is moving out of or being removed from within a region.

The quiescent phase relationship can be set in one of several ways but it is preferable to construct a phase delay element 34 using a small RC network at the input to the phase and frequency comparator 24. This forces the VCO oscillator 22 to run ahead of the reference oscillator 32 by an amount to be balanced between the need for noise immunity and the need for sensitivity. The closer the two phases run, the more sensitive the trigger circuit. The larger the phase shift between them the greater the tolerance for circuit noise, and oscillator jitter. This element 34 sets the triggering threshold.

In the case where the frequency of the reference oscillator is about 32 kHz, the phase delay may be set to a value in the range 0.5 to 4 μs, which is then equivalent to about 6 to 45 degrees and is preferably set to a delay of 1.5 μs.

With respect to RF interference, it is known that capacitive sensors typical of the prior art are frequently vulnerable to false activation due to the effects of stray electromagnetic radiation. In the present invention a high degree of immunity to RF interferences of this type accrues due to the fact that the sensor is based on a PLL circuit which is tuned, or operating at, a specific and low frequency and which therefore has good inherent rejection of frequencies which lie above and below that frequency.

Nevertheless, in application environments spurious RF may occur which is sufficiently intense and at sufficient frequencies so as to falsely trigger the sensor. In view of this, in the preferred embodiment filters 103 and 104 are connected between the sense electrodes and the VCO 22.

These filters reduce the magnitude of the intrusion into the sensor circuit of high frequency signals due to stray or spurious, extraneous RF interferences which may for example be radiated by domestic kitchen appliances such as microwave ovens and also by cell phones and which may otherwise be of sufficient intensity to induce false activation of the sensor. These filters may be comprised of ferrite filters, however in the case of the soap dispenser application, sufficient attenuation may be achieved using a simple network of resistors and capacitors.

Figure 2:
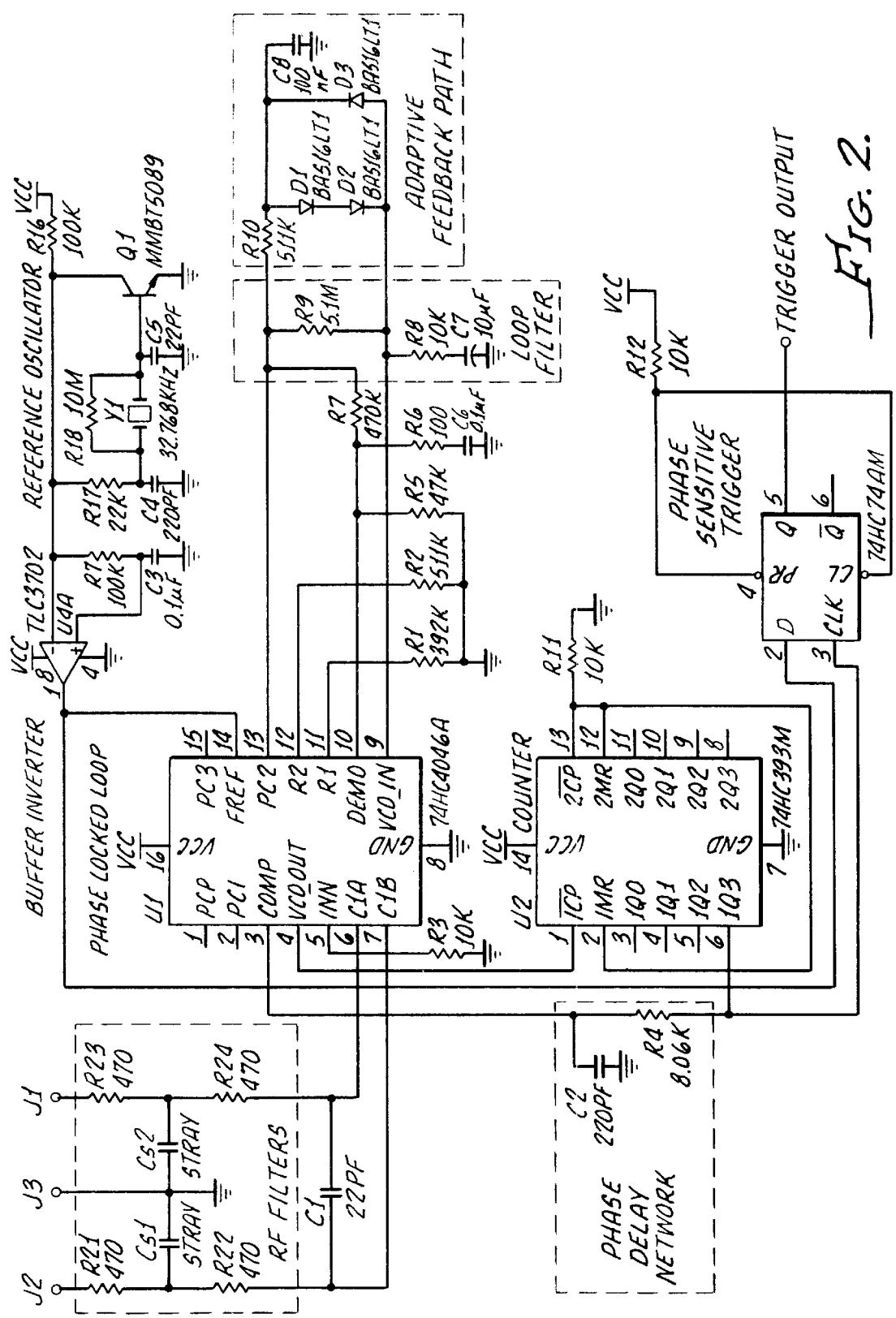
FIG. 2 is a schematic of circuitry shown in block diagram in FIG. 1.

FIG. 2 is a schematic diagram of a practical sensor circuit 10 where the two sense electrodes are connected directly to the points denoted by J1 and J2. In particular this circuit also includes provision for utilization of a shield electrode where the shield electrode is connected directly to the connection point denoted by J3. This circuit may be constructed on a printed circuit board by those of customary skill in the art utilizing the components indicated in FIG. 2. It should also be appreciated that if desired for reasons concerning the economy of high volume mass production, the circuit could be further refined and rendered into a single integrated circuit electronic component known as an application specific integrated circuit (ASIC) by those of customary skill in the art.

The following mathematical representation of the dynamic response of the sensor is provided in order to further explain and illustrate the basic operation of the sensor. The response of the circuit 10 will be different for different shapes of the capacitance change over time. For the soap dispenser application a reasonable approximation to this shape is a ramp change in capacitance. Accordingly, the solution to the analysis of the response of the circuit where the trigger circuit is based on a D-flop and for a ramp change in capacitance is given by:

$$\Phi en(t) = \frac{dCv}{dt} \cdot \frac{1}{Cv \cdot Tdelay \cdot \omega n^2} \cdot$$

$$\left[ 1 - e^{-\zeta \cdot \omega n \cdot t} \cdot \left\{ \cos\left(\sqrt{1-\zeta^2} \cdot \omega n \cdot t\right) + \frac{\zeta}{\sqrt{1-\zeta^2}} \cdot \sin\left(\sqrt{1-\zeta^2} \cdot \omega n \cdot t\right) \right\} \right]$$

where:

$$Ko \cong \frac{2 \cdot \pi \cdot (F2 - F1)}{V2 - V1}$$

Where:

Ko=gain constant

F1=the VCO operating frequency corresponding to the VCO control voltage v1

F2=the VCO operating frequency corresponding to the VCO control voltage V2.

In practice, and depending on the precise characteristics of the specific device or devices used, the gain constant, Ko as expressed in the above equation, is not an exactly linear function of frequency and control voltage. However, it is typically approximately linear over a certain range of values. Moreover for design purposes, in general Ko is a nonlinear function of a range of circuit parameters which may be generically expressed by:

$$Ko=F(Vcc, N, \omega, R1, R2, C)$$

where:

Vcc=the supply voltage and is equal to 3.3V in the circuit depicted in FIG. 2.

N=number of times the VCO frequency is divided due to circuit element 100

ω=the reference oscillator 32 circular frequency $R_1$=resistance value corresponding on the circuit diagram depicted in FIG. 2 to R1

$R_2$=resistance value corresponding on the circuit diagram depicted in FIG. 2 to R2 and where the precise functional relationship required for circuit design purposes, denoted by f in the above equation, may be determined from the detailed data presented in vendor data sheets which, for example, is variously presented graphically in "CD54/74HC4046A Texas Instruments Data Sheet, February 1998, revised May 2000.", which describes operation of the particular PLL circuit element depicted in FIG. 2.

VCO=the middle of the range of the control voltage 102, i.e. Vcc/2 where Vcc is the supply voltage and is equal to 3.3V in the circuit depicted in FIG. 2. Vref= Reference voltage which is internal to the PLL chip.

$$Kd = \frac{Vcc}{4\pi}$$

$$\tau_1 = (R_3 + R_4) \cdot C$$

where $R_3$, $R_4$ and C are the loop filter components (corresponding on the circuit diagram depicted in FIG. 2 to R9, R8 and the capacitance C7.)

t=time

ζ=the damping ratio which is given by:

$$\zeta = \frac{1}{2} \cdot \omega n \cdot \tau_2$$

where:

$$\tau_2 = R_4 \cdot C$$

The equation given above has a leading term which multiplies a time dependent response term. The latter term eventually declines to zero. The magnitude of the initial response, which gives rise to the triggering, is therefore proportional to the leading term and as such one can see that it is proportional to the rate of change of capacitance divided by the total capacitance. The initial response is also inversely proportional to the natural frequency of the loop circuit indicating as one would expect that the response is greater for circuits which correct more slowly.

Figure 3:
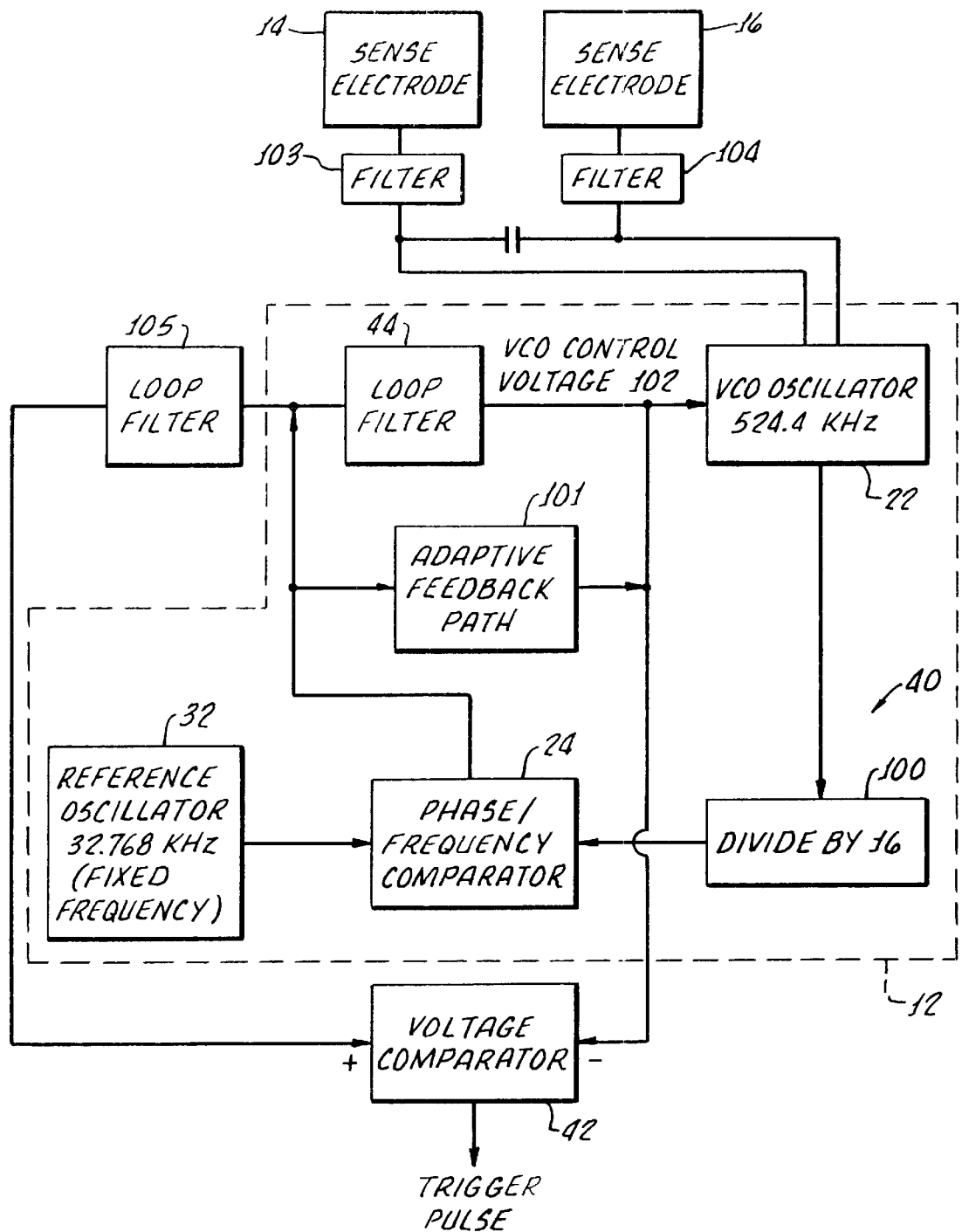
FIG. 3 is a block diagram of an alternative embodiment of the present invention in which a comparator is used for the trigger.

FIG. 3 depicts a block diagram of the sensor electronics 40 in accordance with an alternative embodiment of the present invention, and includes common reference numbers depicting identical or subsequently similar elements described in connection with embodiment 10 shown in FIG. 1. In this embodiment 40, the trigger is based on a voltage comparator 42. This is an alternate method of detection and uses the control circuit of the phase locked loop (PLL) 12. The operation is as follows: As with embodiment 10 shown in FIG. 1, the average control voltage is the voltage required to cause the VCO 22 to operate at the same frequency, after division, as the reference oscillator 32. In this embodiment however there is no phase delay network and instead phase shift errors will cause the phase/frequency comparator 24 to increase or decrease the control voltage 102 until the phase difference is corrected to zero. In this arrangement 40 the phase error signal from the phase/frequency comparator 24 is filtered by a first loop filter which may comprise an RC network 44 and is also filtered by a second filter which may also comprise an RC network 105 and which has a much longer time constant than the first RC network and which provides a voltage reference to the comparator 42. When the control voltage 102 reaches a preset, positive going voltage threshold at the comparator 42, due to detection of a moving object within the activation region of the sense electrodes 14 and 16, the comparator 42 actuates and provides the sensor output trigger signal.

Operating Frequency

The operating frequency of the sensor for a soap dispenser (not shown) is the VCO frequency and is approximately 0.5 MHz (the actual frequency is 16 times the reference oscillator frequency of 32.768 kHz which equals 0.5244 MHz). This frequency is set to be sufficiently high such that a person's hand is always detected by the sensor as a dielectric material as opposed to a conductor sometimes and a dielectric at others which could give rise to variability in activation range and general performance. The issue arises due to the fact that an individual operating the dispenser may or may not be electrically grounded. For instance the operator while requesting soap may at times have one hand in contact with a grounded metal object such as a sink or faucet or be connected to ground electrically by a stream of running water.

In order for the person's hand to then be detected as a dielectric, the frequency needs to exceed the free charge relaxation time of the human body. This time is determined from the product of the skin resistance to ground in ohms and the body's capacitance in Farads. The capacitance of an adult human is in the region of 50 pF. The skin resistance between two hands varies somewhere in the region of from 100 kΩ up to a few MΩ. The RC time constant may therefore be as short as 5 μs which corresponds to a frequency of 0.2 MHz. The operating frequency of 0.5 MHz was therefore selected to give a reasonable margin.

Other potential applications include faucet control. The effective use of capacitive sensors for faucet control may require significantly higher frequencies in the region of 10 MHz or higher. This is, for instance noted, in U.S. Pat. No. 5,730,165 and is generally also documented elsewhere. The reasoning is again based on RC time contents and has to do with the higher conductivities present in a sink environment.

There is no fundamental problem in modifying the design of our sensor to operate at much higher frequencies if desired. In fact, as far as frequency of operation is concerned, the current state-of-the-art in PLL devices extends well into the GHz region. Thus, this design could be modified by "one of customary skills in the art" to operate at any desired frequency up to the GHz region according to the needs of the intended application.

Figure 4:
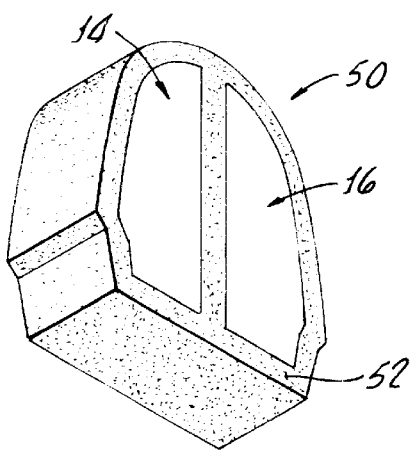
FIG. 4 is a drawing of a sense electrode configuration suitable for use with the block diagram as shown in FIG. 1 or 3.

FIG. 4 illustrates a simulated soap dispenser base 50 having the electrodes 14, 16, formed from copper foil, disposed in a spaced apart relationship for enabling the establishment of an electric field therebetween. The side by side arrangement gives rise to an electric field between the two electrodes which extends outwards from the electrode surfaces and curves between the two. The base 50 also incorporates a shield electrode 52 which in this instance is formed from copper foil and wrapped around the outer side of the base 50.

In this configuration, the magnitude of the field strength declines nonlinearly with distance from the electrodes 14, 16 as does also then the magnitude of the change in capacitance due to the presence of a dielectric material within that field, such as a hand. This kind of side-by-side configuration gives rise to what may be termed a fringing field and the sensor in combination with this electrode configuration may be referred to as a fringing field type of capacitive sensor. As a rough guide, the intensity of the electric field typically declines rapidly in a fringing field at distances which exceed the combined width of the electrodes 14, 16 which in this case is about 3 inches. The front to back extent is 3.1"; the side-to-side extent is 3.25"; the separation is about 0.5"; the gap between the electrodes and the shielded rim is about ¼" all around.

Figure 5:
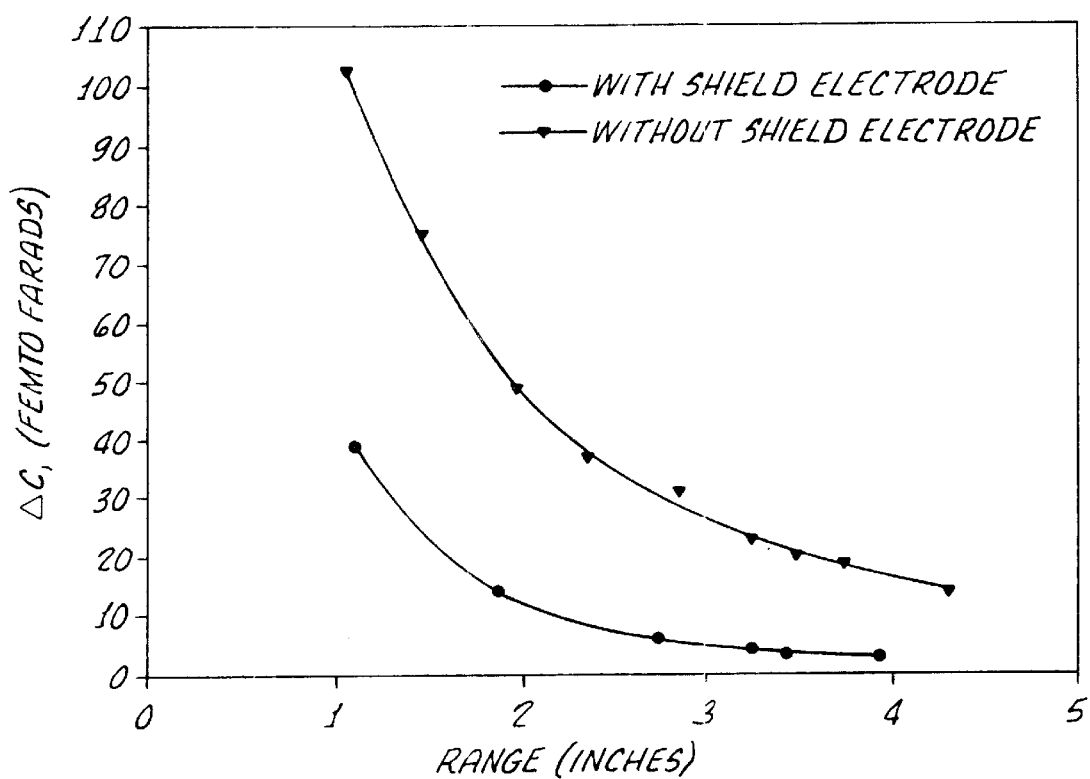
FIG. 5 is plot of measured change in capacitance of sense electrodes shown in FIG. 4 due to flat hand presence.

The change in capacitance due to the presence of a hand at different distance ranges from the simulated base was measured. FIG. 5 shows the changes in capacitance for an adult hand, held flat at different vertical distance ranges above the base 50 where the shield 52 was both present and removed which confirm this. There are two technical side effects to the grounded shield 52. The first is that it raises the overall capacitance of the sense electrode structure by a few pF. The second is that it shunts a portion of the electric field away from the sensing region such that capacitance changes at a fixed distance range decline. This is unavoidable for a grounded shield in close proximity to the sense electrodes and is confirmed by the data depicted in FIG. 5.

Hence for this particular physical structure, the requirement for shielding increases the required sensitivity of the sensor and as confirmed by the test data described herein this sensor has the necessary sensitivity. If sensitivity should ever be an issue for this or other similar applications requiring a similar shielded electrode, then an alternative arrangement which would require less sensitivity is to split the shielding and drive the two halves at the same voltage as the sense electrodes.

Sensor Characterization and Bench Test Data

The data falls into the following categories:

Characterization versus known small capacitance rates of change

Characterization versus response to hand motion above the simulated base

Dynamic Simulation and Test Data

A test arrangement was constructed which was used for characterization and as a means of generating a range of known and reproducible capacitance variations at different representative rates of change of capacitance occurring over different timescales which are representative of hand motion and with time profiles of capacitance change which approximate a ramp. It is based on a parallel plate capacitor comprising two flat parallel electrodes, which are nominally 5 cm by 5 cm square and separated by a distance of 1 cm. Dielectric test samples comprising small squares of pure fused silica measuring ⅜" square by 1 mm thick were used to incrementally increase the capacitance. The material has a known dielectric constant of 3.8.

The incremental increase in capacitance due to the introduction of one such sample into the field region of the capacitor was calculated to be 6.3 fF given the actual precise dimensions of the structure and test samples and assuming a uniform field. A means was devised of introducing and removing the sample into and out of the field region at a known and constant speed. This comprised mounting the sample on a thin plastic disc which traverses the field gap and which is rotated by a small electric motor at a known RPM. This arrangement thus provides a means for simulating rates of change in capacitance due to hand motion.

The following motor RPM's were used where the test sample was situated at the extreme outside edge of the plastic disc. Each rotation gives rise to one positive dC/dt as the sample enters the field between the plates and one negative dC/dt as the sample leaves the field.

| RPM | ω, radians/s | Velocity, cm/s | event duration, ms | dC/dt, fF/s |
|---|---|---|---|---|
| 13.5 | 1.42 | 7.9 | 140 | 45 |
| 23 | 2.41 | 13.4 | 82 | 77 |
| 32 | 3.35 | 18.6 | 59 | 107 |

Since each rotation gives rise to one positive dC/dt and one negative dC/dt the arrangement also allows a test of sensors triggering sensitivity to different dC/dt magnitudes and false triggering to different −dC/dt's. This is also useful since for the soap dispenser application the sensor should not trigger due to hand removal from within the activation region.

The following data relate to approximately 100 revolutions at each speed:

| RPM | Triggering percentage, % | False triggering percentage, % |
|---|---|---|
| 13.5 | 34 | 0 |
| 23 | 91 | 0 |
| 32 | 100 | 0 |

These data taken in combination with those of the previous table, indicate that the sensor is sensitive to events which exceed +77 fF/s with 82 ms duration and is 100% (−1%) successful in these tests at detecting events of +107 fF/s with a duration of 59 ms.

The data also confirms that the sensor is capable of reliably detecting the motion of a small dielectric object other than a hand. The data also confirm that the sensor is functional where the sense electrodes are disposed in a parallel plate type configuration.

Hand Activation Test Data

In order to further provide evidence of reduction to practice and suitability for application in the context of activation of a non-contact soap dispenser, a series of hand activation tests were performed using the simulated soap dispenser base incorporating the fringing field configuration of sense electrodes as well as a shield electrode as depicted in FIG. 4.

By referring to FIG. 5, the required hand speed, can be roughly estimated for reliable activation by approaching vertically to activate the sensor at ranges of 3", 2" and 1". The technical estimate can then be compared with actual data for the same hand. The lower curve indicates a change in capacitance due to a hand at 3" range of about 5 fF, about 12 fF at 2" and an estimated 39 fF at 3". It can be estimated that this change will accrue between an initial hand distance of about 5" and the activation distance of 3" and so on. In order for the rate of change to then be about 100 fF/s the hand speed will need to be about 100*2/5 inches per second=40 inches per second for activation at 3" (50 ms duration), about 100*2/12 inches per second=17 inches per second for activation at 2" (120 ms) and about 100*2/39=5 inches per second for activation at 1" (444 ms). 5 inches per second is a very slow hand speed while 25 to 40 inches per second may be more typical.

The sensor circuit was connected to the simulated base and tested for activation by a hand moving towards the base at what was judged to be normal speed and for repeat activation when the hand is already within the activation region, ten times for each case.

Test: Hand moved sideways into the activation region

| Range, inches | Activations | False triggers |
|---|---|---|
| 3 | 4 | 0 |
| 2.5 | 10 | 0 |
| 2 | 10 | 0 |

Test: Hand moved vertically into the activation region

| Range inches | Activations | False triggers |
|---|---|---|
| 3 | 4 | 0 |
| 2.5 | 8 | 0 |
| 2 | 10 | 0 |

Test: Hand moved ¾ to 1" vertically while within the activation region

| Range, inches | Activations | False triggers |
|---|---|---|
| 4 | 3 | 0 |
| 3.5 | 6 | 0 |
| 3 | 10 | 0 |
| 2.5 | 10 | 0 |

It should be appreciated that the above tests are technical or 'staged' in the sense that care was taken to keep the hand flat and level, which typical users of a soap dispenser would not do, also hand speed is an important factor and this was based on judgment of what might by typical and this would vary in actual use. One can see that according to these data the effective activation distance is in the region of 2.5" to 3" and that this is also in agreement with the technically based estimate. Similarly one can see that there was zero incidence of false triggers meaning that at no time was the sensor activated by hand removal.

The electrical current draw for the circuit 10 is low and substantially less than 1 mA at low voltage. This demonstrates suitability for long term operation using alkaline batteries. This is advantageous for applications in battery powered devices which are preferably intended for continuous operation for extended periods without the need for frequent battery replacement.

Although there has been hereinabove described a control system in accordance with the present invention for the purpose of illustrating the manner to which the invention may by used to advantage, it should be appreciated that the invention is not limited thereto. Accordingly, any and all modifications, variations or equivalent arrangements which may occur to those skilled in the art, should be considered to be within the scope of the invention as defined by the appended claims.

What is claimed is:

1. A capacitive sensor system for controlling operation of a device, the system comprising:
   sense electrodes for enabling establishment of an electric field for intercepting motion of a proximate object; and
   an electronic circuit for providing a control output signal in response to a rate of change in capacitance of the sense electrodes due to motion of the proximate object within the field without intermediate electronic differentiation of signals related to a change in capacitance.

2. The system according to claim 1 wherein said electronic circuit comprises:
   a phase locked loop, including a voltage controlled oscillator (VCO), connected to the sense electrodes, for providing an operating frequency to the sense electrodes;
   a fixed frequency reference oscillator for providing a fixed frequency reference;
   a phase/frequency comparator for comparing a VCO frequency with the fixed reference frequency;
   a phase delay circuit for changing a phase difference between the VCO frequency and the fixed reference oscillator frequency when the loop is phase locked;
   a loop filter for integrating a phase error signal from the phase/frequency comparator in order to define a dynamic response of the loop; and
   a phase sensitive trigger circuit for providing a control output signal in response to change in a phase difference between the fixed reference frequency and the operating frequency.

3. The system according to claim 2 wherein the phase delay circuit is operative for causing the VCO frequency to run ahead of the fixed reference frequency in order that a positive rate of change in capacitance controls operation of the device.

4. The system according to claim 2 wherein the phase delay circuit is operative for causing the VCO frequency to lag behind the fixed reference frequency in order that a negative rate of change in capacitance controls operation of the device.

5. A capacitive sensor system for controlling operation of a device in response to a rate of change in capacitance due to motion of a proximate object, the system comprising:
   at least two sense electrodes disposed in a spaced apart relationship for enabling establishment of an electric field between the sense electrodes, said electric field extending outwardly and between the sense electrodes;
   a phase locked loop, including a voltage controlled oscillator (VCO), connected to the sense electrodes, for providing an operating frequency to the sense electrodes;
   a fixed frequency reference oscillator for providing a fixed frequency reference;
   a phase/frequency comparator for comparing a VCO frequency with the fixed reference frequency;
   a phase delay circuit for causing a phase difference between the VCO frequency and the fixed reference oscillator frequency when the loop is phase locked;
   a loop filter for integrating a phase error signal from the phase/frequency comparator in order to define a dynamic response of the loop; and
   a phase sensitive trigger circuit for providing a control output signal in response to change in a phase difference between the fixed reference frequency and the operating frequency.

6. The system according to claim 5 wherein the phase delay circuit is operative for causing the VCO frequency to run ahead of the fixed reference frequency in order that a positive rate of change in capacitance controls operation of the device.

7. The system according to claim 5 wherein the phase delay circuit is operative for causing the VCO frequency to lag behind the fixed reference frequency in order that a negative rate of change in capacitance controls operation of the device.

8. The system according to any one of claim 5, 6, or 7 wherein the voltage controlled oscillator provides an operating frequency to the sense electrodes sufficiently high to ensure the object is detected by the sense electrodes as a dielectric material.

9. The system according to claim 8 wherein the voltage controlled oscillator provides an operating frequency of less than about 1 MHz for operating a soap dispenser by motion of a human hand.

10. The system according to claim 8 wherein the voltage controlled oscillator provides an operating frequency greater than about 10 MHz for operating a faucet by motion of a human hand.

11. The system according to claim 5 wherein the electrodes are disposed in a planar relationship.

12. The system according to claim 11 further comprising a grounded shield electrode disposed in a spaced apart and surrounding relationship with the sense electrodes, the shield electrode being in a plane generally perpendicular with the sensor electrodes and extending away from the established electrode field.

13. The system according to claim 11 further comprising a grounded shield electrode disposed in a plane generally parallel to the sense electrodes.

14. The system according to claim 5 wherein said trigger circuit comprises a D-Flop circuit.

15. A capacitive sensor system for controlling operation of a device in response to a rate of change in capacitance due to motion of a proximate object, the system comprising:
- at least two sense electrodes disposed in a spaced apart relationship for enabling establishment of an electric field between the sense electrodes, said electric field extending outwardly and between the sense electrodes;
- a phase locked loop, including a voltage controlled oscillator (VCO), connected to the sense electrodes, for providing an operating frequency to the sense electrodes;
- a fixed frequency reference oscillator for providing a fixed frequency reference;
- a loop filter for integrating a phase error signal from the phase/frequency comparator in order to define a dynamic response of the loop; and
- a phase sensitive trigger circuit for providing a control output signal in response to a change in a phase difference between the fixed reference frequency and the operation frequency, the trigger circuit including a voltage comparator, having one side connected to the VCO, and a long time constant loop filter connected between the phase/frequency comparator and the voltage comparator.

16. A capacitive sensor system for controlling operation of a device in response to a rate of change in capacitance due to motion of a proximate object, the system comprising:
- at least two sense electrodes disposed in a spaced apart relationship for enabling the establishment of an electric field between the sense electrodes;
- a phase locked loop, including a voltage controlled oscillator (VCO), connected to the sense electrodes, for providing an operating frequency to the sense electrodes;
- a fixed frequency reference oscillator for providing a fixed frequency reference;
- a phase frequency comparator for comparing a VCO frequency with the fixed reference frequency;
- phase delay circuit connected between said phase/frequency comparator and said voltage controlled oscillator for causing said voltage controlled oscillator to run ahead of the reference oscillator; and
- a trigger circuit for providing a control output in response to a change in phase shift between said fixed frequency and said operating frequency.

17. The system according to claim 16 wherein voltage controlled oscillator provides an operating frequency to the sense electrodes sufficiently high to ensure the object is detected by the sense electrodes as a dielectric material.

18. The system according to claim 17 wherein the voltage controlled oscillator provides an operating frequency of less than about 1 MHz for operating a soap dispenser by motion of a human hand.

19. The system according to claim 17 wherein the voltage controlled oscillator provides an operating frequency greater than about 10 MHz for operating a faucet by motion of a human hand.

20. The system according to claim 19 further comprising a shield electrode disposed in a spaced apart and surrounding relationship with the sense electrodes.

21. The system according to claim 16 wherein said trigger circuit comprises a D-Flop circuit.

22. The system according to claim 5, 15 or 16 further comprising an adaptive feedback path connected between the phase/frequency comparator and the VCO for maintaining a phase difference between the fixed reference frequency and the VCO operating frequency between +90 and −90 degrees.

23. The system according to claim 5, 15 or 16 further comprising an RF attenuating filter interconnected between each sense electrode and the VCO.

24. The system according to claim 5, 15 or 16 further comprising a frequency divider interconnecting the VCO and the phase/frequency comparator.

* * * * *